(12) United States Patent
Yin et al.

(10) Patent No.: US 10,170,043 B2
(45) Date of Patent: Jan. 1, 2019

(54) DISPLAY DRIVING CIRCUIT, ARRAY SUBSTRATE, CIRCUIT DRIVING METHOD, AND DISPLAY DEVICE

(71) Applicant: BOE Technology Group Co., Ltd., Beijing (CN)

(72) Inventors: Xinshe Yin, Beijing (CN); Tuo Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/508,299

(22) PCT Filed: Jul. 4, 2016

(86) PCT No.: PCT/CN2016/088383
§ 371 (c)(1),
(2) Date: Mar. 2, 2017

(87) PCT Pub. No.: WO2017/113679
PCT Pub. Date: Jul. 6, 2017

(65) Prior Publication Data
US 2018/0061318 A1 Mar. 1, 2018

(30) Foreign Application Priority Data

Dec. 31, 2015 (CN) .......................... 2015 1 1032271

(51) Int. Cl.
*G09G 3/3241* (2016.01)
*G09G 3/3233* (2016.01)
(Continued)

(52) U.S. Cl.
CPC ......... *G09G 3/3241* (2013.01); *G09G 3/3233* (2013.01); *G09G 3/3275* (2013.01);
(Continued)

(58) Field of Classification Search
CPC .... G09G 3/3241; G09G 3/3275; H01L 21/84; H01L 27/32; H05B 33/08; H05B 33/14
(Continued)

(56) References Cited

U.S. PATENT DOCUMENTS 7,515,126 B2 * 4/2009 Senda .................. G09G 3/3283
345/77
8,593,378 B2 * 11/2013 Ryu ..................... G09G 3/3233
315/169.3
(Continued)

FOREIGN PATENT DOCUMENTS

CN 1643563 A 7/2005
CN 101145318 A 3/2008
(Continued)

OTHER PUBLICATIONS

Oct. 9, 2016—(WO) International Search Report and Written Opinion Appn PCT/CN2016/088383 with English Tran.
(Continued)

*Primary Examiner* — Prabodh M Dharia
(74) *Attorney, Agent, or Firm* — Banner & Witcoff, Ltd.

(57) ABSTRACT

The application provides a display driving circuit, an array substrate, a circuit driving method, and a display device. The array substrate comprises a plurality of rows of scan lines, a plurality of columns of data lines, and a plurality of pixel units being defined by intersecting of the plurality of rows of scan lines and the plurality of columns of data lines; each column of data lines being connected to a reset module; each column of data lines being further connected to a current control module configured to form a first current flowing from a data line connected thereto to a reference voltage line, wherein the pixel unit includes a first transistor and a second transistor, the first transistor and the second transistor have device parameters that are the same or in a predeter-
(Continued)

mined proportion, and a second electrode of the second transistor is connected to the output terminal.

20 Claims, 7 Drawing Sheets

(51) Int. Cl.
| | |
|---|---|
| G09G 3/3275 | (2016.01) |
| H01L 21/84 | (2006.01) |
| H01L 27/32 | (2006.01) |
| H05B 33/08 | (2006.01) |
| H05B 33/14 | (2006.01) |

(52) U.S. Cl.
CPC .............. *H01L 21/84* (2013.01); *H01L 27/32* (2013.01); *H05B 33/08* (2013.01); *H05B 33/14* (2013.01); *G09G 2300/0842* (2013.01); *G09G 2310/0251* (2013.01); *G09G 2320/043* (2013.01)

(58) Field of Classification Search
USPC ....... 345/58–92, 22; 315/169.3, 172; 348/53
See application file for complete search history.

(56) References Cited

U.S. PATENT DOCUMENTS

| | | | | |
|---|---|---|---|---|
| 2002/0140645 A1* | 10/2002 | Sato | ..................... | G09G 3/3233 345/82 |
| 2007/0152934 A1* | 7/2007 | Maeda | ................. | G09G 3/3233 345/92 |
| 2009/0179838 A1* | 7/2009 | Yamashita | ........... | G09G 3/3233 345/84 |
| 2012/0242643 A1* | 9/2012 | Ono | ..................... | G09G 3/3233 345/212 |
| 2013/0187554 A1* | 7/2013 | Ono | ..................... | G09G 3/3266 315/172 |
| 2013/0215092 A1* | 8/2013 | Wu | ....................... | G09G 3/3233 345/206 |
| 2015/0161940 A1* | 6/2015 | Woo | ....................... | G09G 3/003 345/58 |
| 2016/0019835 A1* | 1/2016 | Han | ....................... | G09G 3/003 348/53 |
| 2016/0148573 A1* | 5/2016 | Lai | ........................ | G09G 3/3233 345/205 |
| 2016/0189610 A1* | 6/2016 | Xiao | ..................... | G09G 3/3233 345/77 |
| 2016/0240142 A1* | 8/2016 | Jeong | .................. | G09G 3/3233 |
| 2017/0316741 A1* | 11/2017 | Kishi | .................. | G09G 3/3275 |
| 2018/0012548 A1* | 1/2018 | Koh | ..................... | G09G 3/3258 |

FOREIGN PATENT DOCUMENTS

| | | |
|---|---|---|
| CN | 101404142 A | 4/2009 |
| CN | 103392199 A | 11/2013 |
| CN | 105609049 A | 5/2016 |
| KR | 100672945 B1 | 1/2007 |
| TW | 200802271 A | 1/2008 |

OTHER PUBLICATIONS

Mar. 3, 2017—(CN) First Office Action Appn 201511032271.6 with English Tran.

* cited by examiner

DISPLAY DRIVING CIRCUIT, ARRAY SUBSTRATE, CIRCUIT DRIVING METHOD, AND DISPLAY DEVICE

The application is a U.S. National Phase Entry of International Application No. PCT/CN2016/088383 filed on Jul. 4, 2016, designating the United States of America and claiming priority to Chinese Patent Application No. 201511032271.6 filed on Dec. 31, 2015. The present application claims priority to and the benefit of the above-identified applications and the above-identified applications are incorporated by reference herein in their entirety.

TECHNICAL FIELD

The embodiments of the present disclosure relate to the filed of display, and more particularly to a display driving circuit, an array substrate, a circuit driving method, and a display device.

BACKGROUND

In a display device formed by a current-driven light-emitting element existing in the prior art, the problem of transistor threshold voltage is one of the most primary problems affecting display performance. Specifically, a driving current of a light-emitting element is supplied by a transistor under the control of a corresponding data voltage. Once threshold voltages of transistors of different pixels have a difference of more than 0.1 V, the driving current under the same data voltage will show significant deviation, which will cause a difference in luminance of light-emitting elements of different pixels, and result in an hourglass phenomenon on a display image.

In order to compensate for the threshold voltage of each transistor, a circuit in the prior art typically first stores threshold voltages of transistors that drive pixels in a storage capacitor prior to displaying light-emission in the manner of adding transistors and adding signal lines in a row direction, so as to counteract the influence caused by threshold voltages on the driving current at the time of light emission. However, as the market's demands for high resolution increase, the number of transistors and the number of signal lines in the row direction required for the threshold voltage compensation circuit of such type have become a requirement that is impossible to meet. Therefore, how to reduce the number of transistors within a pixel area and the number of signal lines in the row direction while realizing the function of threshold voltage compensation has become an urgent technical problem that needs to be solved in meeting the needs of high-resolution of display products in the art.

SUMMARY

In view of the problems existing in the prior art, the embodiments of the present disclosure provide a display driving circuit, an array substrate, a circuit driving method, and a display device, the present disclosure can reduce the number of transistors within a pixel area and the number of signal lines in the row direction while realizing the function of threshold voltage compensation.

In a first aspect, an embodiment of the present disclosure provides a display driving circuit, being connected to one scan line and one data line, and comprising a pixel unit, a reset module, and a current control module, wherein the reset module is connected to a reset signal line and the data line, respectively, and configured to set a voltage on the data line to a preset initial voltage when an active level is on the reset signal line;

the current control module is connected to a reference signal line, a data voltage signal line, and the data line, respectively, and configured to form a first current flowing from the data line to the reference voltage line, a magnitude of the first current being controlled by a voltage on the data voltage signal line; and the pixel unit is connected to the scan line, the data line, a preset-level voltage line, and an output terminal for outputting a driving current, and configured to output the driving current to the output terminal when an active level is on the scan line.

Optionally, the pixel unit includes a first transistor, a second transistor, a first capacitor, and a connection enable module, the first transistor and the second transistor have device parameters that are the same or in a predetermined proportion, gates of the first transistor and the second transistor are both connected to a first node, and first electrodes of the first transistor and the second transistor are both connected to the preset-level voltage line;

the connection enable module is connected to the first node, a second electrode of the first transistor, the data line, and the scan line, respectively, and configured to enable the first node, the second electrode of the first transistor, and the data line to be connected when an active level is on the scan line;

the first capacitor is connected between the first node and the preset-level voltage line; and a second electrode of the second transistor is connected to the output terminal for outputting the driving current.

Optionally, the connection enable module includes a third transistor and a fourth transistor, wherein a gate of the third transistor is connected to the scan line, the first electrode of the third transistor is connected to the second electrode of the first transistor, and the second electrode of the third transistor is connected to the data line; and a gate of the fourth transistor is connected to the scan line, a first electrode of the fourth transistor is connected to the first node, and a second electrode of the fourth transistor is connected to the second electrode of the first transistor.

Optionally, the reset module includes a fifth transistor, a gate of the fifth transistor is connected to the reset signal line, a first electrode of the fifth transistor is connected to the data line, and a second electrode of the fifth transistor is connected to the preset initial voltage; and the fifth transistor forms complementary driving with respect to the first transistor, the second transistor, the third transistor, and the fourth transistor.

Optionally, the current control module includes a sixth transistor, a gate of the sixth transistor is connected to the data voltage signal line, a first electrode of the sixth transistor is connected to the data line, and a second electrode of the sixth transistor is connected to the reference voltage line; and the sixth transistor forms complementary driving with respect to the first transistor, the second transistor, the third transistor, and the fourth transistor.

Optionally, a channel length of the sixth transistor is greater than a predetermined value, so that a threshold voltage of the sixth transistor is stabilized at a set value.

Optionally, the display driving circuit further comprises a block module disposed between the second electrode of the second transistor and the output terminal for outputting the driving current; the block module being connected to one control signal line, and configured to block outputting of the driving current when an active level is on the control signal line.

Optionally, the block module includes a seventh transistor, a gate of the seventh transistor is connected to the control signal line, a first electrode of the seventh transistor is connected to the second electrode of the second transistor, and a second electrode of the seventh transistor is connected to the output terminal for outputting the driving current.

In a second aspect, an embodiment of the present disclosure further provides an array substrate, comprising a plurality of rows of scan lines and a plurality of columns of data lines, a plurality of pixel units being defined by intersecting of the plurality of rows of scan lines and the plurality of columns of data lines;

each column of data lines being connected to a reset module configured to set a voltage on a data line connected thereto to a preset initial voltage when an active level is on a reset signal line;

each column of data lines being further connected to a current control module configured to form a first current flowing from a data line connected thereto to a reference voltage line, a magnitude of the first current being controlled by a voltage on a data voltage signal line in this column; and each of the pixel units being connected to one of the scan lines, one of the data lines, a preset-level voltage line, and an output terminal for outputting a driving current, and configured to output the driving current to the output terminal when an active level is on the scan line connected thereto.

Optionally, a first transistor, a second transistor, a first capacitor, and a connection enable module are disposed within each of the pixel units, the first transistor and the second transistor have device parameters that are the same or in a predetermined proportion, gates of the first transistor and the second transistor are both connected to a first node, and first electrodes of the first transistor and the second transistor are both connected to the preset-level voltage line;

the connection enable module is connected to one scan line corresponding to a pertained pixel unit, and configured to enable the first node, a second electrode of the first transistor, and one data line corresponding to the pertained pixel unit to be connected when an active level is on the scan line;

the first capacitor is connected between the first node and the preset-level voltage line; and a second electrode of the second transistor is connected to the output terminal for outputting the driving current of the pertained pixel unit.

Optionally, the connection enable module includes a third transistor and a fourth transistor; wherein a gate of the third transistor is connected to the scan line corresponding to the pertained pixel unit, a first electrode of the third transistor is connected to the second electrode of the first transistor, and a second electrode of the third transistor is connected to the data line in a pertained column; and a gate of the fourth transistor is connected to the scan line corresponding to the pertained pixel unit, a first electrode of the fourth transistor is connected to the first node, and a second electrode of the fourth transistor is connected to the second electrode of the first transistor.

Optionally, the reset module includes a fifth transistor, a gate of the fifth transistor is connected to the reset signal line, a first electrode of the fifth transistor is connected to the data line, and a second electrode of the fifth transistor is connected to the preset initial voltage; and the fifth transistor forms complementary driving with respect to the first transistor, the second transistor, the third transistor, and the fourth transistor.

Optionally, the current control module includes a sixth transistor, a gate of the sixth transistor is connected to the data voltage signal line, a first electrode of the sixth transistor is connected to the data line, and a second electrode of the sixth transistor is connected to the reference voltage line; and the sixth transistor forms complementary driving with respect to the first transistor, the second transistor, the third transistor, and the fourth transistor.

Optionally, a channel length of the sixth transistor is greater than a predetermined value, so that a threshold voltage of the sixth transistor is stabilized at a set value.

Optionally, a block module disposed between the second electrode of the second transistor and the output terminal is further comprised in the pixel unit; the block module is connected to one control signal line, and configured to block outputting of the driving current of the pertained pixel unit when an active level is on the control signal line connected thereto.

Optionally, the block module includes a seventh transistor, a gate of the seventh transistor is connected to the control signal line, a first electrode of the seventh transistor is connected to the second electrode of the second transistor, and a second electrode of the seventh transistor is connected to the output terminal for outputting the driving current.

In a third aspect, an embodiment of the present disclosure further provides a circuit driving method of any of the display driving circuit described above, the circuit driving method comprising:

within a first period during which an active level is on the scan line, outputting an active level to the reset signal line, and outputting a preset voltage to the data voltage data signal; and within a second period during which an active level is on the scan line, outputting an inactive level to the reset signal line, and outputting a data voltage to the data voltage data signal.

Optionally, the display driving circuit further comprises a block module disposed between the second electrode of the second transistor and the output terminal for outputting the driving current; the block module being connected to one control signal line, and configured to block outputting of the driving current when an active level is on the control signal line; and the circuit driving method further comprises:

when an active level is on the scan line, outputting an active level to the control signal line connected to the block module.

In a fourth aspect, an embodiment of the present disclosure further provides a circuit driving method of any of the array substrate described above, the circuit driving method comprising:

within a first period during which an active level is on any row of scan lines, outputting an active level to the reset signal line, and outputting a preset voltage to the plurality of columns of data voltage signal lines; and within a second period during which an active level is on this row of scan lines, outputting an inactive level to the reset signal line, and outputting a group of data voltages corresponding to this row to the plurality of columns of data voltage signal lines.

Optionally, the display driving circuit further comprises a block module disposed between the second electrode of the second transistor and the output terminal for outputting the driving current is further comprised in the pixel unit; the block module being connected to one control signal line, and configured to block outputting of the driving current of the pertained pixel unit when an active level is on the control signal line connected thereto; and the circuit driving method further comprises:

when an active level is on any row of scan lines, outputting an active level to the control signal line connected to the block module within the pixel unit corresponding to this row of scan lines.

In a fifth aspect, an embodiment of the present disclosure further provides a display device, comprising any of the display driving circuit described above or any of the array substrate described above.

Optionally, the display device comprises any of the array substrate described above, and further comprises an organic light-emitting layer disposed on the array substrate and an electrode layer disposed on the organic light-emitting layer; the organic light-emitting layer is in mutual contact with the output terminal within each of the pixel units.

By means of adopting the mirror-constant-current-source structure and setting the first transistor and the second transistor which are mirrored to each other, the embodiments of the present disclosure can realize writing of the data voltage through modulation on a source-drain current of the first transistor by using an equal relationship between source-drain currents of the two transistors. In a case where the current control module can accurately lock the magnitude of the first current, magnitudes of source-drain currents of the first transistor and the second transistor can also be obtained by the equal relationship without being affected by the threshold voltages. Based on this, the present disclosure does not need to set switching transistors and signal lines in the row direction for writing the threshold voltages, and can realize column-to-multiplexing of the reset module and the current control module, effectively reduce the number of transistors within the pixel unit and the number of signal lines in the row direction, which facilitates simplifying circuit structure and circuit timing, reducing area of the pixel unit, thus achieving stable high-resolution displaying.

BRIEF DESCRIPTION OF THE DRAWINGS

In order to more clearly illustrate the technical solutions in the embodiments of the present disclosure or the technical solutions in the prior art, drawings necessary for describing the embodiments or the prior art will be briefly introduced below, obviously, the following drawings are parts of the embodiments of the present disclosure, and for a person of ordinary skill in the art, it is possible to obtain other drawings based on these drawings without paying creative efforts.

DETAILED DESCRIPTION OF THE EMBODIMENTS

To make the objects, technical solutions, and advantages of the present disclosure more clear and obvious, hereinafter, the technical solutions in the embodiments of the present disclosure will be described clearly and comprehensively in combination with the drawings, obviously, these described embodiments are parts of the embodiments of the present disclosure, rather than all of the embodiments thereof. All the other embodiments obtained by a person of ordinary skill in the art based on the embodiments of the present disclosure without paying creative efforts fall into the protection scope of the present disclosure.

Figure 1:
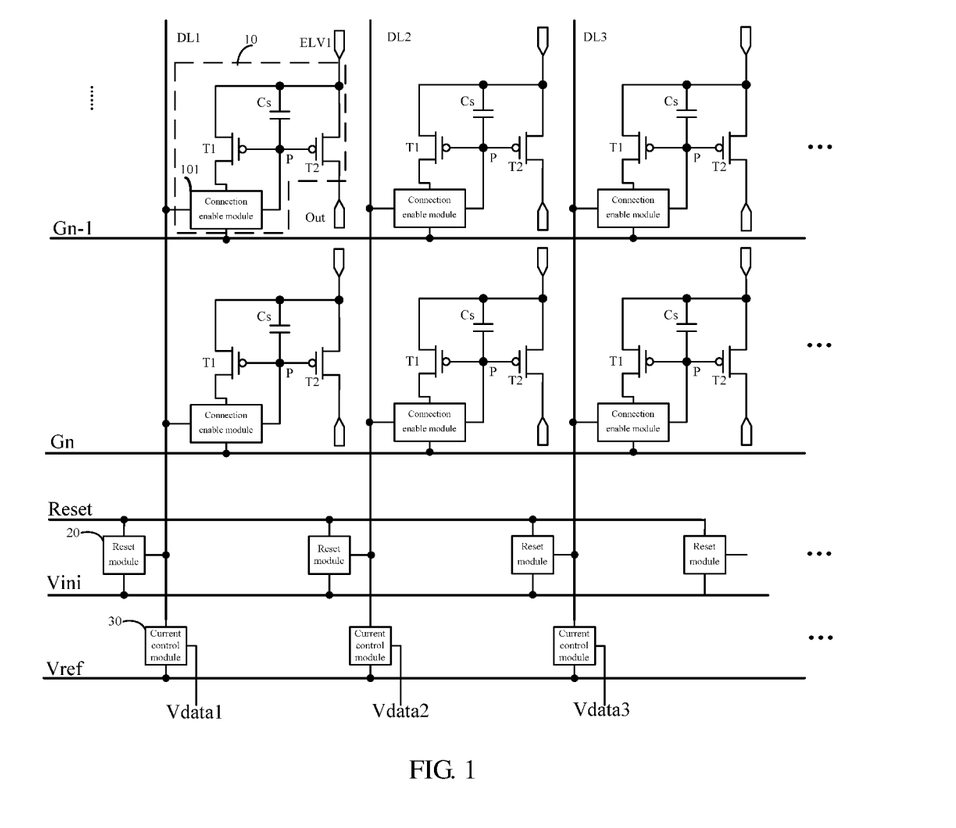
FIG. 1 is a schematic diagram of structure of an array substrate in an embodiment of the present disclosure.

An embodiment of the present disclosure provides an array substrate, as shown in FIG. 1, the array substrate comprises a plurality of rows of scan lines (e.g., scan lines Gn−1, Gn in an (n−1)-th row and an n-th row as shown in FIG. 1, n being an integer larger than or equal to one) and a plurality of columns of data lines (e.g., data lines DL1, DL2, and DL3 in the first, second, and third columns as shown in FIG. 1), a plurality of pixel units 10 (which may be understood as an area on the array substrate) are defined by intersecting of the plurality of rows of scan lines and the plurality of columns of data lines. It is to be understood that, each pixel unit in the embodiment of the present disclosure may correspond to one scan line and one data line, for example, each pixel unit 10 in FIG. 1 corresponds to one scan line located below the pixel unit and adjacent to the pixel unit, and each pixel unit 10 corresponds to one data line located leftward to the pixel unit and adjacent to the pixel unit.

On the basis of the above, the array substrate shown in FIG. 1 specifically comprises:

each column of data lines being connected to a reset module 20 configured to set a voltage on a data line connected thereto to a preset initial voltage Vini when an active level is on a reset signal line Reset;

each column of data lines being further connected to a current control module 30 configured to form a first current flowing from a data line connected thereto to a reference voltage line Vref, a magnitude of the first current being controlled by a voltage on a data voltage signal line (e.g., Vdata 1, Vdata2, and Vdata 3 in FIG. 1) in this column;

a first transistor T1, a second transistor T2, a first capacitor Cs, and a connection enable module 101 are disposed within each pixel unit 10, wherein the first transistor T1 and the second transistor T2 have device parameters that are the same or in a predetermined proportion (they may be mirror transistors to each other in the embodiment of the present disclosure), gates of the first transistor T1 and the second transistor T2 are both connected to a first node P, and first electrodes of the first transistor T1 and the second transistor T2 are both connected to a preset-level voltage line ELV1;

the connection enable module 101 is connected to one scan line corresponding to a pertained pixel unit, and configured to connect the first node P, a second electrode of the first transistor T1, and one data line corresponding to the pertained pixel unit when an active level is on the scan line;

the first capacitor Cs is connected between the first node P and the preset-level voltage line ELV1; and a second electrode of the second transistor T2 is connected to an output terminal Out for outputting a driving current of the pertained pixel unit.

It needs to be noted that, transistors adopted in all of the embodiments of the present disclosure may be a thin film transistor or an FET (Field Effect Transistor), or other devices of the same properties. When the source and the drain of the adopted transistors have a symmetrical structure, the source and the drain of these transistors may not be particularly distinguished. In the embodiments of the present disclosure, in order to distinguish the two electrodes other than the gate of the transistors, one electrode thereof is called a first electrode, the other electrode thereof is called a second electrode. In addition, according to a channel type of transistors, the transistors may be classified into two types, P-type transistor and N-type transistor, for example, when the P-type transistor is adopted, the first electrode may be the source of the P-type transistor, and the second electrode may be the drain of the P-type transistor; and when the N-type transistor is adopted, the first electrode may be the drain of the N-type transistor, and the second electrode may be the source of the N-type transistor.

It is to be understood that, the array substrate provided by the embodiment of the present disclosure may further comprises an organic light-emitting layer (not shown), in addition to a plurality of rows of scan lines and a plurality of columns of data lines. The driving current outputted from the output terminal Out within any pixel unit may drive at least part of the organic light emitting layer to form organic light emitting displaying. Of course, the organic light-emitting layer may be provided on another array substrate independent of the aforesaid array substrate, so that organic light-emitting displaying can be formed by pairing of the two substrates, and the present disclosure makes no limitations thereto.

It is to be understood that, the reset module 20 is configured to set a voltage on a data line connected thereto to a preset initial voltage Vini when an active level is on a reset signal line Reset, the reset module 20 having the aforesaid function and property can be easily obtained by a person skilled in the art according to a switching circuit in the prior art, details will not be repeated here.

It is to be understood that, the active level refers to a level on the reset signal line Reset when the reset module 20 is operating, and it may be a high level or a low level in particular, depending on a circuit condition of the reset module 20. The high level and the low level refer to two logic states represented by a potential height range at a certain circuit node location. For example, the active level on the reset signal line Reset may be a high level higher than a common terminal voltage by 3 V or more, and levels outside this range all are an inactive level; or the active level on the reset signal line Reset may be a low level less than the common terminal voltage by 3V or more, and levels outside this range all are an inactive level. It is to be understood that, specific potential height ranges for a high level, a low level, an active level, and an inactive level at each circuit node may be set as desired in a particular application scenario, and the present disclosure makes no limitations thereto.

It is to be understood that, the current control module 30 is configured to form a first current flowing from a data line connected thereto to a reference voltage line Vref, a magnitude of the first current being controlled by a voltage on a data voltage signal line in this column, so that a person skilled in the art can implement the current control module 30 in accordance with a current control circuit, a current limiting circuit, or a current modulation circuit in the prior art, and the present disclosure makes no limitations thereto.

It needs to be noted that, since the reset module 20 and the current control module 30 are disposed on each column of data lines, thus they may be specifically disposed outside the display area, so that their constituent parts are not restricted by manufacturing process in the display area. For example, the reset module 20 and the current control module 30 may be both disposed between a data line extending out of the display area and an external source driver IC, so that a sufficiently large design space at this location can guarantee circuit performance of the reset module 20 and the current control module 30.

By means of adopting the mirror-constant-current-source structure and setting the first transistor T1 and the second transistor T2 which are mirrored to each other, the embodiments of the present disclosure can realize writing of the data voltage through modulation on a source-drain current of the first transistor T1 by using an equal relationship between source-drain currents of the two transistors. In a case where the current control module 30 can accurately lock the magnitude of the first current, magnitudes of source-drain currents of the first transistor T1 and the second transistor T2 may be subjected to equal relationship or proportional relationship without being affected by the threshold voltages.

Specifically, referring to FIG. 1, when the voltage on one row of scan lines (taking the scan line Gn−1 in FIG. 1 as an example) starts to shift to an active level, any connection enable module 101 connected to this row of scan lines Gn−1 enables the first node P and a second electrode of the first transistor T1 within a pertained pixel unit and one data line DL1 in a pertained column to be connected. Thereby, the reset module 20 connected to the data line DL1 starts to set the data line DL1, the first node P, and the second electrode of the first transistor T1 to a preset initial voltage Vini under the action of the active level provided on the reset signal line Reset. Thereafter, the reset signal line Reset shifts to an inactive level, and all the data voltage signal lines start to load the data voltage, so that the current control module 30 connected to the data line DL1 can form the above-mentioned first current with a corresponding magnitude under the control of the data voltage signal line Vdata1. It is to be understood that, in this case, the first current is formed between the preset-level voltage line ELV1 and the reference voltage line Vref, and flows through the first transistor T1, the connection enable module 101, the data line DL1, and the current control module 30 in sequence. It can be inferred that, the magnitude of the first current, which serves as a source-drain current of the first transistor T1 at this time, is controlled by the current control module 30, so that a gate-source voltage of the first transistor T1 can be stored and maintained by the first capacitor Cs. According to the mirror image relationship between the first transistor T1 and the second transistor T2, a magnitude of the current flowing from the preset-level voltage line ELV1 to the output terminal Out is the same as the magnitude of the first current, therefore, the output terminal Out can be provided with a driving current whose magnitude is totally controlled by the voltage on the data voltage signal line Vdata1.

Based on this, the present disclosure does not need to set switching transistors and signal lines in the row direction for writing the threshold voltages, and can realize column-to-multiplexing of the reset module and the flow control module, effectively reduce the number of transistors within the pixel unit and the number of signal lines in the row direction, which facilitates simplifying circuit structure and circuit timing, reducing area of the pixel unit, thus achieving stable high-resolution displaying.

In addition, it is to be understood that, the preset-level voltage line ELV1 described above needs to cooperate with the reference voltage line Vref, so as to provide the second transistor T2 with the first current that has the same magnitude as the driving current, thus voltage ranges set for the preset-level voltage line ELV1 and the reference voltage line Vref need to be large enough to be able to provide any driving current with a desired value. Of course, ranges of voltages on the reference voltage line Vref and the preset level voltage line ELV1 may be set adaptively depending on a different value range of the driving current, and the embodiment of the present disclosure makes no limitations thereto.

Figure 2:
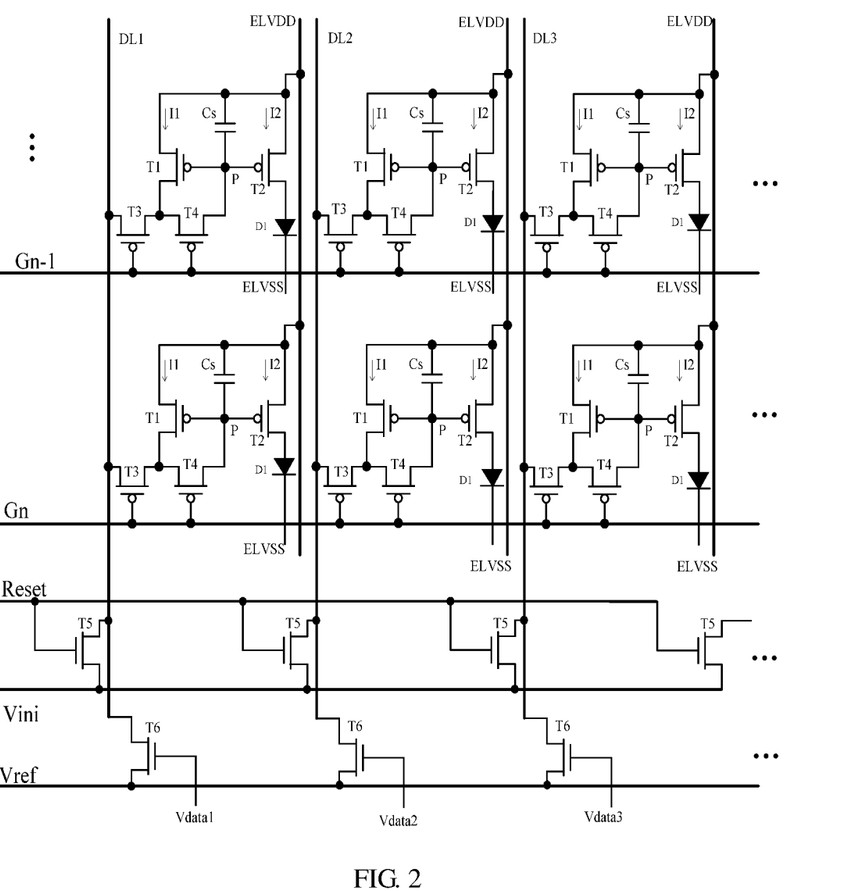
FIG. 2 is a schematic diagram of circuit structure of an array substrate in an embodiment of the present disclosure.

As a specific example, FIG. 2 is a schematic diagram of circuit structure of an array substrate in an embodiment of the present disclosure. Reference is made to FIG. 2.

As a specific example of internal structure of the pixel unit 10, a first transistor T1, a second transistor T2, a first capacitor Cs, and a connection enable module 101 are disposed within the pixel unit 10 in the embodiment of the present disclosure. The first transistor T1, the second transistor T2, and the first capacitor Cs in the embodiment of the present disclosure constitute a basic mirror-constant-current-source circuit, gates of the first transistor T1 and the second transistor T2 are both connected to the first node P, and first electrodes of the first transistor T1 and the second transistor T2 are both connected to a first preset voltage line ELVDD; a second electrode of the second transistor T2 is connected to the output terminal for outputting the driving current of a pertained pixel unit; the first capacitor Cs is connected between the first node P and the first preset-level voltage line ELVDD, wherein a first electrode of the first capacitor Cs is connected to the first preset-level voltage line ELVDD, and the second electrode is connected to the first node P.

It is to be understood that, the first transistor T1, the second transistor T2, the first capacitor Cs, and the connection enable module 101 within one pixel unit 10, as well as one scan line and one data line corresponding to the pixel unit 10, the reset module and the current control module connected to the data line together form a display driving circuit corresponding to a single light-emitting device D1, this display driving circuit can provide a driving current to the light-emitting device D1 according to a magnitude of the voltage on the data voltage data signal line. It is to be understood that, each display driving circuit is connected to one scan line and one data line, and is further connected to a preset-level voltage line, a reference voltage line, a reset signal line, a data voltage signal line, and an output terminal for outputting a driving current. For example, corresponding to the circuit structure of the array substrate shown in FIG. 2, FIG. 3 shows a schematic diagram of circuit structure of a display driving circuit in an embodiment of the present disclosure.

Figure 3:
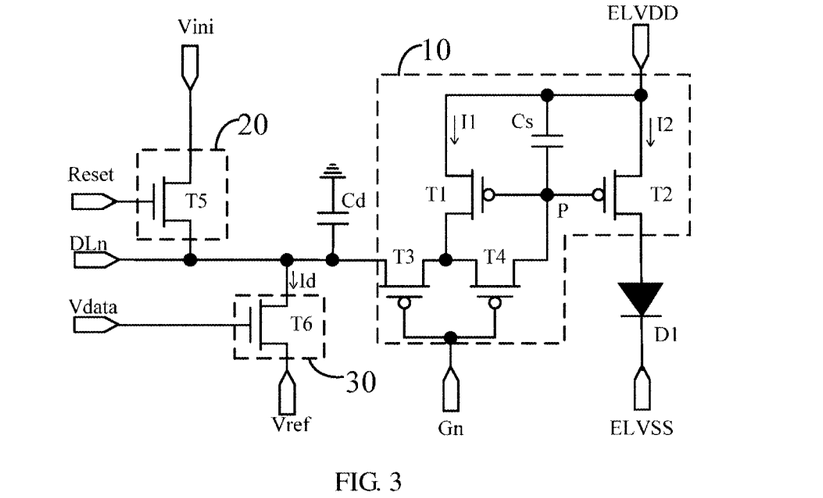
FIG. 3 is a schematic diagram of circuit structure of a display driving circuit in an embodiment of the present disclosure.

As an example of setting manner of the first transistor and the second transistor, as shown in FIG. 3, according to an On-current formula of the thin film transistor, the first current I1 and the gate-source voltage Vgs of the first transistor T1 satisfy the following relation:

$$I1 = \frac{\mu_P C_{ox}}{2} \frac{W_1}{L_1} (V_{gs} - V_{th})^2 \qquad (1)$$

and the second current I2 and the gate-source voltage Vgs of the second transistor T2 satisfy the following relation:

$$I2 = \frac{\mu_P C_{ox}}{2} \frac{W_2}{L_2} (V_{gs} - V_{th})^2 \qquad (2)$$

In the embodiment of the present disclosure, the first transistor T1 and the second transistor T2 both operate in a linear region and are produced by adopting the same manufacturing process so as to have the same device parameters, thus the first transistor T1 and the second transistor T2 have the same threshold voltage $V_{th}$, the same field-effect mobility $\mu_P$, and the same insulating layer capacitance per unit area $C_{ox}$, i.e., the first current I1 passing through the first electrode of the first transistor T1 is mirrored to the first electrode of the second transistor T2 to form the second current I2. In order to make the performance of the first transistor T1 and the second transistor T2 closer, channels of the first transistor T1 and the second transistor T2 may be wired at the same time so that channel directions stay consistent.

In practice, if there is a difference in the channels of the first transistor T1 and the second transistor T2, it is assumed that a channel width-to-length ratio of the first transistor T1 is $$\frac{W_1}{L_1}$$

and a channel width-to-length ratio of the second transistor T2 is $$\frac{W_2}{L_2},$$

then the first current I1 and the second current I2 satisfy the following relation:

$$I2 = \frac{W_2}{L_2} \Big/ \frac{W_1}{L_1} \times I1 \qquad (3)$$

In the embodiment of the present disclosure, currents of the first transistor T1 and the second transistor T2 can be adjusted by adjusting the channel width-to-length ratios of the two transistors.

As a specific example of the connection enable module 101, as shown in FIGS. 2 and 3, the connection enable module 101 includes a third transistor T3 and a fourth transistor T4. A gate of the fourth transistor T4 is connected to a pertained scan line Gn, a source of the fourth transistor T4 is connected to the first node P, and a drain of the fourth transistor T4 is connected to a source of the third transistor. A gate of the third transistor T3 is connected to the gate of the fourth transistor T4, a first electrode of the third transistor T3 is connected to the second electrode of the first transistor T1, and a second electrode of the third transistor T3 is connected to the data line DLn in a pertained column (not shown). When the scan line Gn is at an active level, the third transistor T3 and the fourth transistor T4 are turned on, thus the first node P, the second electrode of the first transistor T1, and the data line in a pertained column are enabled to be connected, and form a mirror-constant-current-source circuit, in this case, the fourth transistor T4 short-circuits the gate and the second electrode of the first transistor T1. The first capacitor Cs is a storage capacitor, and the first capacitor Cs can store the gate-source voltage Vgs of the first transistor T1 and the second transistor T2 when the first transistor T1 and the second transistor T2 are in operation. When the fourth transistor T4 is turned off, the first capacitor Cs can maintain the gate source voltage Vgs, so that the second current I2 outputted from the second transistor T2 maintains the first current I1 passing through the first transistor T1 when being mirrored. The third transistor T3 is a charging switch for connecting the data line DLn in a pertained column and the basic mirror-constant-current-source source circuit.

It can be seen that only four transistors and one capacitor are disposed in the pixel unit 10 provided in the embodiment of the present disclosure, and a size of the pixel unit can be greatly reduced as compared with the prior art.

As a specific example of the reset module 20, as shown in FIGS. 2 and 3, the reset module 20 includes a fifth transistor T5. A gate of the fifth transistor T5 is connected to the reset signal line Reset, a first electrode of the fifth transistor T5 is connected to the data line DLn in a pertained column, and a second electrode of the fifth transistor T5 is connected to the preset initial voltage Vini. In order to simplify circuit structure of the array substrate, each column of pixel unit in the embodiment of the present disclosure can multiplex one fifth transistor T5 to implement resetting of the data line DLn in a pertained column and the second electrode of the first capacitor Cs within the pixel unit. In practice, the specific structure of the reset module 20 may be selected by a person skilled in the art according to an application scenario, the embodiment of the present disclosure makes no limitations thereto.

As a specific example of the current control module 30, as shown in FIGS. 2 and 3, the current control module 30 includes a sixth transistor T6. A gate of the sixth transistor T6 is connected to the data voltage signal line, a first electrode of the sixth transistor T6 is connected to the data line the data line DLn in a pertained column, and a second electrode of the sixth transistor T6 is connected to the reference voltage line Vref. The sixth transistor T6 generates the source-drain current Id flowing through the source and the drain of the sixth transistor in accordance with the data voltage Vdata outputted by the source driver IC when the scan line Gn in a pertained row is at the active level. When the voltage of the data line DLn in a pertained column is balanced with the voltage of the first capacitor Cs, the first current I1 of the first transistor T1 is equal to the source-drain current Id of the sixth transistor T6.

In order to simplify circuit structure of the array substrate, in the embodiment of the present disclosure, each column of pixel units can multiplex one sixth transistor T6 to realize data voltage writing. Because the sixth transistors are disposed outside the pixel unit and of a small number, stable threshold voltage characteristics are realized by adjustment of process parameters (i.e., threshold voltages of all the sixth transistors T6 in the array substrate can be controlled within a given value range). In practice, a person skilled in the art can select a specific structure of the current control module 30 according to an application scenario, and the embodiment of the present disclosure makes no limitations thereto.

In practice, in an embodiment of the present disclosure, a channel length of the sixth transistor T6 is set to be larger than a predetermined value so as to stabilize the threshold voltage of the sixth transistor at a set value. This predetermined value refers to a channel length required when a transistor having threshold voltage characteristics in a standard range (e.g., 0.295 V to 0.305 V) is produced according to the conventional manufacturing process. With the above setting, in the embodiment of the present disclosure, the sixth transistor T6 may be disposed at an edge of the array substrate, so that the channel length of the sixth transistor T6 becomes very long without being limited to the manufacturing process. By adopting the same manufacturing process, the sixth transistors T6 in the different columns on the same array substrate are made to have the same parameters, so that grains contained in their channels are the same, which achieves equivalence of threshold voltages of the sixth transistors T6 in different columns on the same array substrate. Alternatively, threshold voltages between the sixth transistors T6 in different columns remain substantially the same or change with the same amount under the same conditions, so that the pixel current is not affected by the threshold voltage when outputting the driving current.

Figure 4:
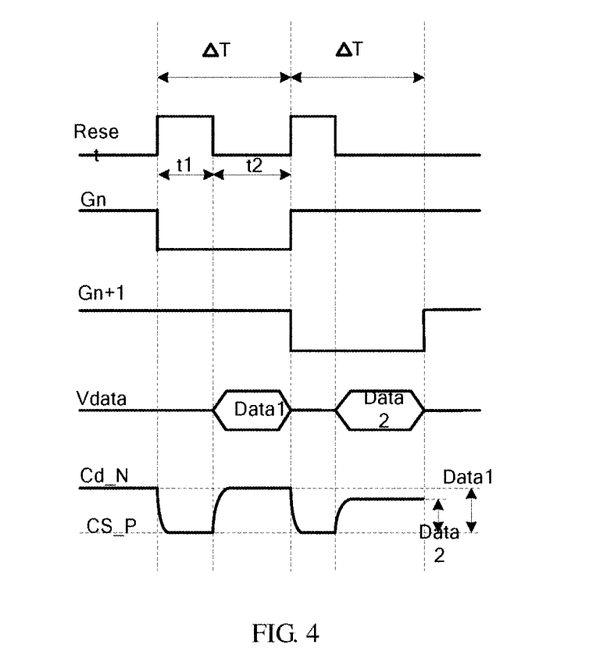
FIG. 4 is an operation timing diagram of the display driving circuit in FIG. 3.

FIG. 4 is an operation timing diagram of a display driving circuit in an embodiment of the present disclosure. In this embodiment, explanation is provided with the first transistor T1, the second transistor T2, the third transistor T3, and the fourth transistor T4 being P-channel thin film transistors, and the fifth transistor T5 and the sixth transistor T6 being N-channel thin film transistors as an example. As shown in FIG. 4, the array substrate provided in the embodiment of the present disclosure includes two periods in one driving cycle ΔT for each row of scan lines: a reset period t1 and a data writing period t2, and the two periods are described in detail below.

Reset period t1: at this time, the reset signal line Reset is at a high level, and the fifth transistor T5 is turned on. The scan line Gn is at a low level, and the third transistor T3 and the fourth transistor T4 are turned on. A parasitic capacitor Cd of the data line DLn in the column to which the pixel unit pertains and the first capacitor Cs within the pixel unit 10 discharge the preset initial voltage Vini through the third transistor T3, the fourth transistor T4, and the fifth transistor T5, and finally, potentials of the data line DLn, the first node P, and the second electrode of the first capacitor Cs are all clamped to the preset initial voltage Vini, in this case, the first transistor T1 and the fourth transistor T4 constitute a diode.

In the embodiment of the present disclosure, the preset initial voltage Vini is required to satisfy: the first preset voltage line ELVDD must be able to charge the first capacitor Cs and the data line DLn through the first transistor T1 under any grayscale. In practice, the preset initial voltage Vini needs to be smaller than a minimum level corresponding to the first capacitor Cs and the data line DLn under all grayscales.

Data writing period t2: at this time, the reset signal line Reset is at a low level, and the fifth transistor T5 is turned off; the data voltage Vdata outputted by the data voltage signal line enables the sixth transistor T6 to be turned on; the scan line Gn remains a low level, the three-transistor T3 and the fourth transistor T4 remain turned-on.

The first preset voltage line ELVDD charges the first capacitor Cs and the data line DLn through the diode formed by the first transistor T1 and the fourth transistor T4 at the reset period t1. Since the preset initial voltage Vini is relatively low, at the very beginning, the first current I1 flowing through the first transistor T1 is relatively large, but as the first capacitor Cs and the parasitic capacitor Cd are charged, the potential at the first node P rises, thus the first current I1 passing through the transistor T1 decreases. When the first current I1 of the first transistor T1 is equal to the source-drain current Id of the sixth transistor T6, charge on the data line DLn and the first capacitor Cs shows a stable state, in this case, I1=Id. In other words, in the embodiment of the present disclosure, the first current I1 of the first transistor T1 can be controlled by the data voltage Vdata, in this case, the voltage across two terminals of the first capacitor Cs is the gate-source voltage Vgs of the first transistor T1 required to output the first current I1, and then it is mirrored to the second transistor T2 through the basic mirror-constant-current-source circuit to output a constant second constant current I2.

It will be understood that, in this period, the source driver IC outputs a data voltage Vdata which may represent a grayscale. The data voltage Vdata is outputted to the gate of the sixth transistor T6, and the source of the sixth transistor T6 is connected to a ground line or the reference voltage line Vref. Since the data voltage Vdata and the voltage Vr of the reference voltage line Vref are stable, the source-drain current Id passing through the sixth transistor T6 is:

$$Id = \frac{\mu_P C_{ox}}{2} \frac{W_6}{L_6} (V_{data} - V_r - V_{th})^2 \qquad (4)$$

Since the sixth transistors T6 in different columns have the same threshold voltage Vth, and when Vdata and Vr are stable, the source and drain currents Id of the sixth transistors T6 are constant.

When the reference voltage Vref is connected to the ground line, Formula (4) can be collated as:

$$Id = \frac{\mu_P C_{ox}}{2} \frac{W_6}{L_6} (V_{data} - V_{th})^2 \qquad (5)$$

Constant current driving period: when the scan line Gn changes to be at a high level, the third transistor T3 and the fourth transistor T4 are turned off. Since the first capacitor Cs maintains the gate-source voltage Vgs, the second transistor T2 can maintain to output the second current I2.

In practice, when the scan line Gn is enabled, the reset unit 20 discharges the data line DLn in the reset period t1, and charges the data line DLn in the data writing period t2, finally, a level of the data line DLn reaches balance when the basic mirror-constant-source circuit and the sixth transistor T6 reach current balance. In the above process, the basic mirror-constant-source circuit charges through the first transistor T1, and the charging current is mirrored to the second transistor T2, in this case, the output current of the second transistor T2 ligentens the organic light-emitting layer, so that the organic light-emitting layer emits light with a certain luminance, and a magnitude of the output current affects a displayed grayscale value.

Figure 5:
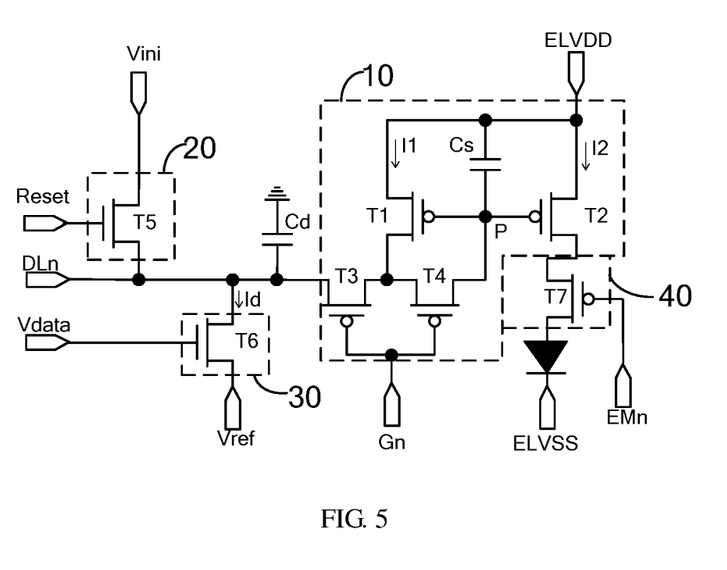
FIG. 5 is a schematic diagram of circuit structure of a display driving circuit in another embodiment of the present disclosure.

In order to solve the above problem, another embodiment of the present disclosure provides a display driving circuit, as shown in FIG. 5, optionally, a block module 40 is disposed between the second electrode of the second transistor T2 and the output terminal. The block module 40 is connected to a control signal line Emn in a pertained row, and configured to block outputting of the driving current of a pertained pixel unit when an active level is on the control signal line connected thereto. With the aforesaid setting, it can prevent the organic light-emitting layer from emitting light when the data voltage is being written.

As a specific example of the block module 40, as shown in FIG. 5, the block module 40 includes a seventh transistor T7. A gate of the seventh transistor T7 is connected to the control signal line EMn, a first electrode of the seventh transistor T7 is connected to the second electrode of the second transistor T2, and a second electrode of the seventh transistor T7 is connected to the output terminal for outputting the driving current.

Figure 6:
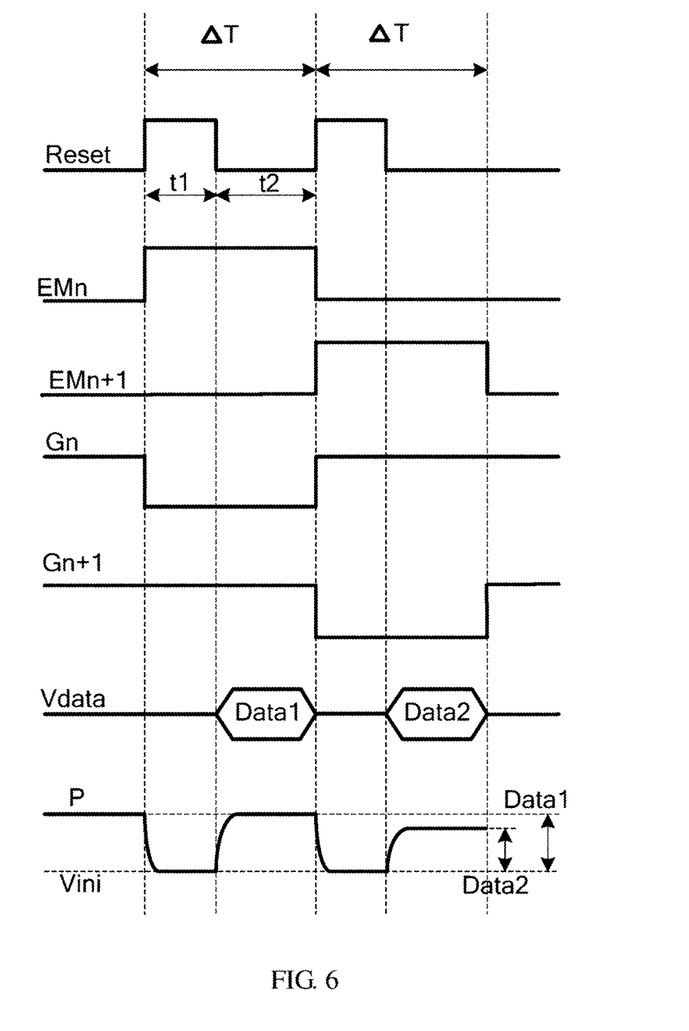
FIG. 6 is an operation timing diagram of the display driving circuit in FIG. 5.

FIG. 6 is an operation timing diagram of the display driving circuit in FIG. 5. When FIG. 6 is compared with FIG. 4, it can be known that difference lies in when the scan line Gn in the row to which the pixel unit pertains is at an active level, the control signal line EMn is at an inactive level, and the seventh transistor T7 is turned off, thereby ensuring that the light emitting device D1 is not lightened when the data line DLn is charged in the data writing period t2. Operations of the rest parts have already been described in detail above, the details will be repeated here.

In practice, no matter N-channel TFT or P-channel TFT is adopted as the block module, the block module always can achieve the effect of preventing the organic light-emitting layer from emitting light when the data voltage is being written. A person skilled in the art can also set the block module as other circuit implementation manners, which also falls into the protection scope of the present disclosure. In addition, a person skilled in the art can select to use an array substrate that includes a block module or an array substrate that does not include a block module, depending on different contrast requirements in application scenes, and the embodiment of the present disclosure makes no limitations thereto.

Figure 7:
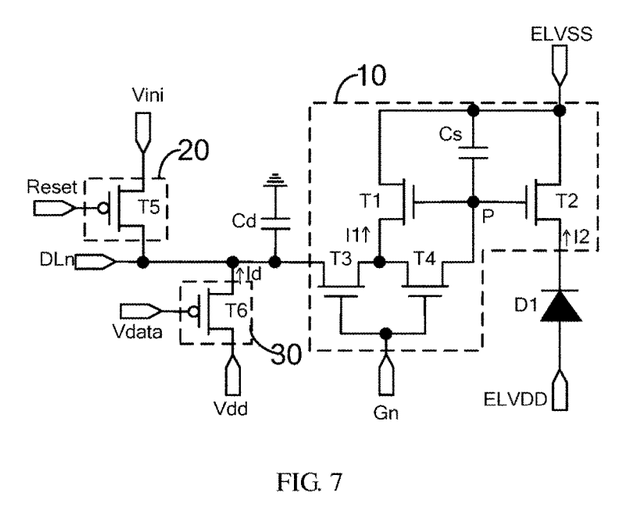
FIG. 7 is a schematic diagram of circuit structure of a display driving circuit in yet another embodiment of the present disclosure.

FIG. 7 is a schematic diagram of circuit structure of a display driving circuit in yet another embodiment of the present disclosure. In this embodiment, explanation is provided with the first transistor T1, the second transistor T2, the third transistor T3, and the fourth transistor T4 being N-channel thin film transistors, and the fifth transistor T5 and the sixth transistor T6 being P-channel thin film transistors as an example. As shown in FIG. 7, gates of the first transistor T1 and the second transistor T2 are both connected to the first node P, first electrodes of the first transistor T1 and the second transistor T2 are both connected to a second preset voltage line ELVSS, the second electrode of the second transistor T2 is connected to the second predetermined voltage line ELVSS, the first electrode of the capacitor Cs is connected to the second preset voltage line ELVSS, and a second electrode of the capacitor Cs is connected to the first node P. Gates of the fourth transistor T4 and the third transistor T3 are both connected to the pertained scan line Gn, wherein the first electrode of the fourth transistor T4 is connected to the first node P, the second electrode of the fourth transistor T4 is connected to the first electrode of the third transistor T3 and the second electrode of the first transistor T1, and the second electrode of the third transistor T3 is connected to the data line DLn in the pertained column. The gate of the fifth transistor T5 is connected to the reset signal line Reset, the first electrode of the fifth transistor T5 is connected to the data line DLn in the pertained column, and the second electrode of the fifth transistor T5 is connected to the preset initial voltage Vini. The gate of the sixth transistor T6 is connected to the data voltage signal line, the first electrode of the sixth transistor T6 is connected to the data line DLn in the pertained column, and the second electrode of the sixth transistor T6 is connected to the reference voltage line Vref.

Figure 8:
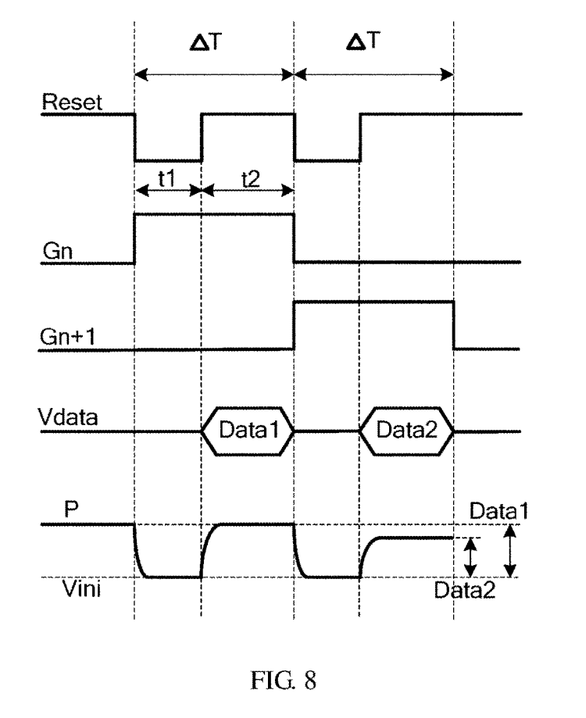
FIG. 8 is an operation timing diagram of the display driving circuit in FIG. 7.

FIG. 8 is an operation timing diagram of the display driving circuit in FIG. 7, as shown FIG. 8, reset period t1: at this time, the reset signal line Reset is at a low level, and the fifth transistor T5 is turned on. The scan line Gn is at a high level, and the third transistor T3 and the fourth transistor T4 are turned on. A parasitic capacitor Cd of the data line DLn in the column to which the pixel unit pertains and the first capacitor Cs within the pixel unit 10 discharge the second preset voltage line ELVSS through the third transistor T3, the fourth transistor T4, and the fifth transistor T5, and finally, potentials of the data line DLn, the first node P, and the second electrode of the first capacitor Cs are all clamped to the level on the second preset voltage line ELVSS. Since, levels at the sources of the first transistor T1 and the second transistor T2 also are the level on the second preset voltage line ELVSS, thus the first transistor T1 and the second transistor T2 are turned off.

Data writing period t2: at this time, the reset signal line Reset is at a high level, and the fifth transistor is turned off; the scan line maintains to be at a low level, the third transistor T3 and the fourth transistor T4 remain turned-on. A grayscale data voltage Vdata outputted by the source driver IC flows to the gate of the sixth transistor T6, and reference may be made to Formula (4) for a calculating method of the source-drain current Id that passes through the sixth transistor.

The preset high-level voltage VDD charges the data line DLn and the first capacitor Cs with a constant source-drain current Id through the sixth transistor T6, potentials of the data line DLn and the first capacitor Cs rise from the level of the second preset voltage line ELVSS, and the first current I1 and the second current I2 also start to rise. When I1=Id, voltages of the data line DLn and the first capacitor Cs are balanced, in this case, the voltage of the first capacitor Cs is the gate-source voltage Vgs at the time of outputting the constant current.

After the scan line Gn corresponding to the pertained pixel unit becomes a low level, the third transistor T3 and the fourth transistor T4 are turned off, and the gate-source voltage Vgs maintained by the first capacitor Cs causes the second transistor to output the constant second current I2, so that pixels maintain a corresponding luminance.

It is to be understood that the block module may also be disposed between the second electrode of the second transistor T2 and the second preset voltage line ELVSS, which have already been described in the above, details will not be repeated here.

It is to be understood that, in FIGS. 4 and 7 in the embodiment of the present disclosure, the fifth transistor T5 forms complementary driving with respect to the first transistor T1, the second transistor T2, the third transistor T3, and the fourth transistor T4, and/or, the sixth transistor T6 forms complementary driving with respect to the first transistor T1, the second transistor T2, the third transistor T3, and the fourth transistor T4. This manner facilitates reducing power consumption caused by threshold loss. The complementary driving specifically refers to that when the first transistor, the second transistor, the third transistor, and the fourth transistor are N-type transistors, the fifth transistor T5 or the sixth transistor T6 is a P-type transistor; when the first transistor, the second transistor, the third transistor, and the fourth transistor are P-type transistors, the fifth transistor T5 or the sixth transistor T6 is an N-type transistor. Of course, the first transistor T1 to the sixth transistor T6 may also employ the same type of channel, which can also reduce the number of transistors within a pixel area and the number of signal lines in the row direction while realizing the function of threshold voltage compensation, a person skilled in the art may make a selection depending on a specific scenario, the embodiment of the present disclosure makes no limitations thereto.

It is to be further understood that the display driving circuit in the embodiment of the present disclosure may be implemented as a circuit that outputs the driving current for a single light-emitting device, and may also be used in combination according to structure of the array substrate described above, the embodiment of the present disclosure makes no limitations thereto.

Figure 9:
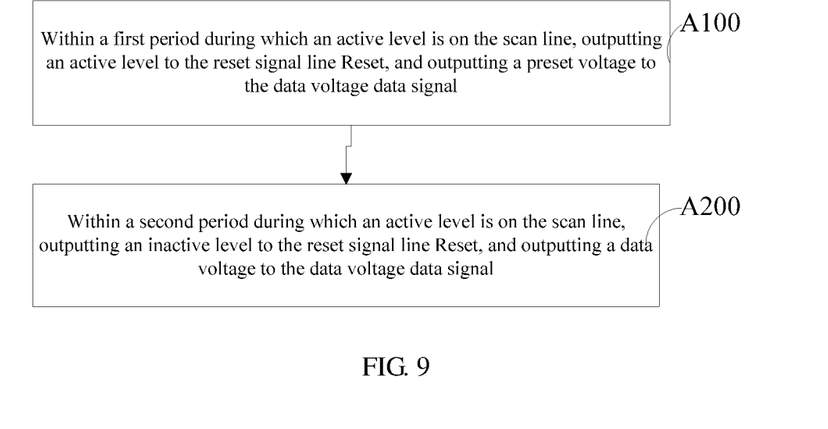
FIG. 9 is a schematic diagram of flow steps of a circuit driving method of a display driving circuit in an embodiment of the present disclosure.

An embodiment of the present application further provides a circuit driving method for any of the display driving circuit described above, as shown in FIG. 9, the circuit driving method comprises:

step A100, within a first period during which an active level is on the scan line, outputting an active level to the reset signal line Reset, and outputting a preset voltage to the data voltage data signal; and step A200, within a second period during which an active level is on the scan line, outputting an inactive level to the reset signal line Reset, and outputting a data voltage to the data voltage data signal.

Figure 10:
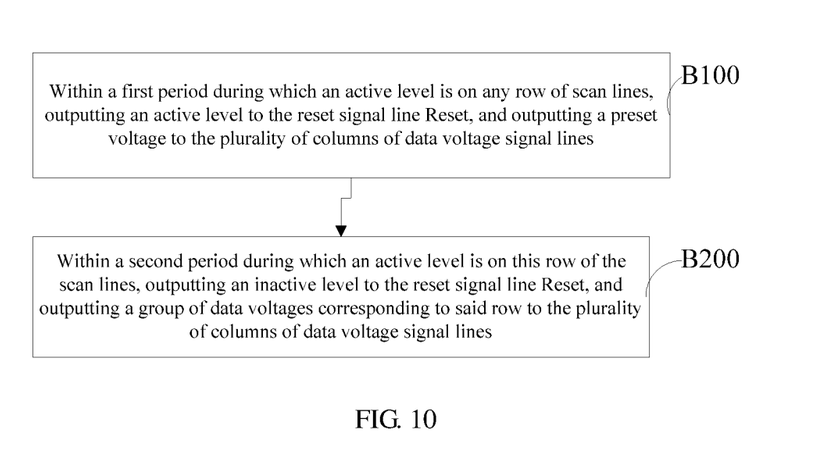
FIG. 10 is a schematic diagram of flow steps of a circuit driving method of an array substrate in an embodiment of the present disclosure.

Similarly, an embodiment of the present application further provides a circuit driving method for any of the array substrate described above, as shown in FIG. 10, the circuit driving method comprises:

step B100, within a first period during which an active level is on any row of scan lines, outputting an active level to the reset signal line Reset, and outputting a preset voltage to the plurality of columns of data voltage signal lines; and step B200, within a second period during which an active level is on this row of the scan lines, outputting an inactive level to the reset signal line Reset, and outputting a group of data voltages corresponding to said row to the plurality of columns of data voltage signal lines.

It should be noted that the preset voltage in the embodiment of the present disclosure may be a constant voltage capable of making a magnitude of the first current in the control module be zero, so as to prevent the reset module from being affected by the current control module in the process of setting the voltage on the connected data line to the preset initial voltage. It is to be understood that the first period in the embodiment of the present disclosure corresponds to the reset period t1 described above, and the second period thereof corresponds to the data writing period t2 described above.

It is to be understood that, operation principles of the circuit driving method provided by the embodiment of the present disclosure are the same as those of the circuit structure of the array substrate shown in FIG. 1 and the circuit timing sequence shown in FIG. 4 or FIG. 6, therefore, the circuit driving method provided by the embodiment of the present disclosure may have corresponding specific implementations, details will not be repeated here.

Optionally, a block module 40 is further comprised within the pixel unit on the array substrate described above, the block module 40 is disposed between the second electrode of the second transistor T2 and the output terminal for outputting the driving current; the block module 40 is connected to one control signal line, and configured to block outputting of the driving current of the pertained pixel unit when an active level is on the control signal line connected thereto; and the circuit driving method further comprises: when an active level is on any row of scan lines, outputting an active level to the control signal line connected to the block module 40 within the pixel unit corresponding to this row of scan lines.

It is to be understood that, the control signal line is connected to a signal input terminal of the block module. When the control signal line is at an active level, the block module allows the pixel unit to output the driving current, so as to make the organic light emitting layer emit light with a certain luminance; when the control signal line is at an inactive level, the block module plays the role of blocking the output of the driving current from the pixel unit, in this case, it is impossible for the pixel unit to output the driving current, accordingly, the organic light-emitting layer does not emit light. A person skilled in the art can configure a circuit with a block module according to a specific situation, and the embodiment of the present invention makes no limitations thereto.

An embodiment of the present application further provides a display device, comprising any of the array substrate described above or any of the display driving circuit described above. Optionally, when the display device comprises any of the array substrate described above, the display device may further comprise an organic light-emitting layer disposed on the array substrate and an electrode layer disposed on the organic light-emitting layer; the organic light-emitting layer is in mutual contact with the output terminal within each of said pixel unit. Therefore, the display device may regard each part of the organic light-emitting layer as the light-emitting device described above, and regard the electrode layer as one electrode connected to the first preset voltage line ELVDD or the second preset voltage line ELVSS, thus forming OLED (Organic Light-Emitting Diode) displaying. The display device may be display panel, electronic paper, mobile phone, tablet computer, television, laptop, digital photo frame, navigation systems and any other products or components having a display function. Since the display device comprises any of the array substrate described above, it can solve the same technical problems and achieve the same technical effect, the details will not be repeated here.

In the specification provided herein, a plenty of particular details are described. However, it can be appreciated that an embodiment of the present disclosure may be practiced without these particular details. In some embodiments, well known methods, structures and technologies are not illustrated in detail so as not to obscure understanding of the specification.

Similarly, it should be understood that in order to make the present disclosure brief and help to understand one or more of the various aspects of the present disclosure, the various features of the present disclosure, in the aforesaid description of illustrative embodiments of the present disclosure, are sometimes grouped into a single embodiment, drawing, or description thereof. However, the disclosed method should not be explained as reflecting the following intention: i.e. the present disclosure sought for protection claims more features than the features clearly defined in any claim. To put more precisely, as is reflected in the following claims, the aspects of the present disclosure contains less features than all the features of a single embodiment disclosed hereinbefore. Therefore, the claims complying with a specific embodiment are explicitly incorporated into the specific embodiment, wherein every claim itself acts as an individual embodiment of the present disclosure.

In the description of the present disclosure, it should be noted that orientation or position relationships indicated by the terms "above", "under" etc. are orientation or position shown based on the drawings, which are only to facilitate describing the present disclosure and simplifying the description, rather than to indicate or imply that the device or element referred must have a particular orientation, constructed or operated with a particular orientation, and therefore cannot be construed as limiting the present disclosure. Unless otherwise expressly specified and limited, the terms "installation", "connected", "connection" should be broadly understood, for example, it may be fixedly connected, or removably connected, or integrally connected; it may also be mechanically connected, or electrically connected; it may also be directly connected, or indirectly connected through an middleware, or two components may be internally communicated. For a person of ordinary skill in the art, the meaning of the aforesaid terms in the present disclosure should be understood according to practice.

It should be also noted that, in the specification, the relationship terms such as "first", "second", and so on are used only to differentiate one entity or operation from another entity or operation, not necessarily requiring or implying that these entities or operations have any of such actual relationships or sequences. And the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment. In the case that there is no further limitation, elements defined by the expressions "comprise one . . . " do not exclude there being additional identity elements in the procedure, method, product or equipment of the elements.

The above embodiments are merely exemplary ones adopted for explaining the technical solutions of the present disclosure, rather than limiting the present disclosure. Although the present disclosure has been described in detail with reference to the embodiments of, a person of ordinary skill in the art should understand that various modifications may also be made to the technical solutions recorded in the preceding embodiments, or parts of the technical features thereof may be replaced by equivalents, and essence of the corresponding technical solutions with these modifications or replacements still falls into the spirit and scope of the embodiments of the present disclosure.

The present application claims priority of the Chinese Patent Application No. 201511032271.6 filed on Dec. 31, 2015, the entire disclosure of which is hereby incorporated in full text by reference as part of the present application.

What is claimed is:

1. A display driving circuit, being connected to one scan line and one data line, and comprising a pixel unit, a reset module, and a current control module, wherein the reset module is connected to a reset signal line and the data line, respectively, and configured to set a voltage on the data line to a preset initial voltage when an active level is on the reset signal line;

the current control module is connected to a reference signal line, a data voltage signal line, and the data line, respectively, and configured to form a first current flowing from the data line to the reference voltage line, a magnitude of the first current being controlled by a voltage on the data voltage signal line; and the pixel unit is connected to the scan line, the data line, a preset-level voltage line, and an output terminal for outputting a driving current, and configured to output the driving current to the output terminal when the active level is on the scan line, wherein the pixel unit includes a first transistor and a second transistor, the first transistor and the second transistor have device parameters that are the same or in a predetermined proportion, gates of the first transistor and the second transistor are both connected to a first node, and first electrodes of the first transistor and the second transistor are both connected to the preset-level voltage line; and a second electrode of the second transistor is connected to the output terminal for outputting the driving current.

2. The display driving circuit according to claim 1, wherein the pixel unit further includes a first capacitor and a connection enable module, the connection enable module is connected to the first node, a second electrode of the first transistor, the data line, and the scan line, respectively, and configured to enable the first node, the second electrode of the first transistor, and the data line to be connected when the active level is on the scan line; and the first capacitor is connected between the first node and the preset-level voltage line.

3. The display driving circuit according to claim 2, wherein the connection enable module includes a third transistor and a fourth transistor;

a gate of the third transistor is connected to the scan line, the first electrode of the third transistor is connected to the second electrode of the first transistor, and the second electrode of the third transistor is connected to the data line; and a gate of the fourth transistor is connected to the scan line, a first electrode of the fourth transistor is connected to the first node, and a second electrode of the fourth transistor is connected to the second electrode of the first transistor.

4. The display driving circuit according to claim 3, wherein the reset module includes a fifth transistor, a gate of the fifth transistor is connected to the reset signal line, a first electrode of the fifth transistor is connected to the data line, and a second electrode of the fifth transistor is connected to the preset initial voltage; and the fifth transistor forms complementary driving with respect to the first transistor, the second transistor, the third transistor, and the fourth transistor.

5. The display driving circuit according to claim 3, wherein the current control module includes a sixth transistor, a gate of the sixth transistor is connected to the data voltage signal line, a first electrode of the sixth transistor is connected to the data line, and a second electrode of the sixth transistor is connected to the reference voltage line; and the sixth transistor forms complementary driving with respect to the first transistor, the second transistor, the third transistor, and the fourth transistor.

6. The display driving circuit according to claim 5, wherein a channel length of the sixth transistor is greater than a predetermined value, so that a threshold voltage of the sixth transistor is stabilized at a set value.

7. The display driving circuit according to claim 2, further comprising a block module disposed between the second electrode of the second transistor and the output terminal for outputting the driving current; the block module being connected to one control signal line, and configured to block outputting of the driving current when the active level is on the control signal line.

8. The display driving circuit according to claim 7, wherein the block module includes a seventh transistor, a gate of the seventh transistor is connected to the control signal line, a first electrode of the seventh transistor is connected to the second electrode of the second transistor, and a second electrode of the seventh transistor is connected to the output terminal for outputting the driving current.

9. A circuit driving method of the display driving circuit as claimed in claim 1, comprising:

within a first period during which an active level is on the scan line, outputting an active level to the reset signal line, and outputting a preset voltage to the data voltage data signal; and within a second period during which an active level is on the scan line, outputting an inactive level to the reset signal line, and outputting a data voltage to the data voltage data signal, wherein the display driving circuit further comprises a block module disposed between the second electrode of the second transistor and the output terminal for outputting the driving current; the block module being connected to one control signal line, and configured to block outputting of the driving current when an active level is on the control signal line; and the circuit driving method further comprises:

when an active level is on the scan line, outputting an active level to the control signal line connected to the block module.

10. An array substrate, comprising a plurality of rows of scan lines and a plurality of columns of data lines, a plurality of pixel units being defined by intersecting of the plurality of rows of scan lines and the plurality of columns of data lines;

each column of data lines being connected to a reset module configured to set a voltage on the data line connected thereto to a preset initial voltage when an active level is on a reset signal line;

each column of data lines being further connected to a current control module configured to form a first current flowing from a data line connected thereto to a reference voltage line, a magnitude of the first current being controlled by a voltage on a data voltage signal line in this column; and each of the pixel units being connected to one of the scan lines, one of the data lines, a preset-level voltage line, and an output terminal for outputting a driving current, and configured to output the driving current to the output terminal when an active level is on the scan line connected thereto, wherein each of the pixel units includes a first transistor and a second transistor, the first transistor and the second transistor have device parameters that are the same or in a predetermined proportion, gates of the first transistor and the second transistor are both connected to a first node, and first electrodes of the first transistor and the second transistor are both connected to the preset-level voltage line, and a second electrode of the second transistor is connected to the output terminal for outputting the driving current of a pertained pixel unit.

11. The array substrate according to claim 10, wherein a first capacitor and a connection enable module are disposed within each of the pixel units, the first transistor and the second transistor have device parameters that are the same or in a predetermined proportion, gates of the first transistor and the second transistor are both connected to a first node, and first electrodes of the first transistor and the second transistor are both connected to the preset-level voltage line;

the connection enable module is connected to one scan line corresponding to the pertained pixel unit, and configured to enable the first node, a second electrode of the first transistor, and one data line corresponding to the pertained pixel unit to be connected when the active level is on the scan line; and the first capacitor is connected between the first node and the preset-level voltage line.

12. The array substrate according to claim 11, wherein the connection enable module includes a third transistor and a fourth transistor;

a gate of the third transistor is connected to the scan line corresponding to the pertained pixel unit, a first electrode of the third transistor is connected to the second electrode of the first transistor, and a second electrode of the third transistor is connected to the data line in a pertained column; and a gate of the fourth transistor is connected to the scan line corresponding to the pertained pixel unit, a first electrode of the fourth transistor is connected to the first node, and a second electrode of the fourth transistor is connected to the second electrode of the first transistor.

13. The array substrate according to claim 12, wherein the reset module includes a fifth transistor, a gate of the fifth transistor is connected to the reset signal line, a first electrode of the fifth transistor is connected to the data line, and a second electrode of the fifth transistor is connected to the preset initial voltage; and the fifth transistor forms complementary driving with respect to the first transistor, the second transistor, the third transistor, and the fourth transistor.

14. The array substrate according to claim 12, wherein the current control module includes a sixth transistor, a gate of the sixth transistor is connected to the data voltage signal line, a first electrode of the sixth transistor is connected to the data line, and a second electrode of the sixth transistor is connected to the reference voltage line; and the sixth transistor forms complementary driving with respect to the first transistor, the second transistor, the third transistor, and the fourth transistor.

15. The array substrate according to claim 14, wherein a channel length of the sixth transistor is greater than a predetermined value, so that a threshold voltage of the sixth transistor is stabilized at a set value.

16. The array substrate according to claim 11, wherein a block module disposed between the second electrode of the second transistor and the output terminal is further comprised in the pixel unit; and the block module is connected to one control signal line, and configured to block outputting of the driving current of the pertained pixel unit when an active level is on the control signal line connected thereto.

17. The array substrate according to claim 16, wherein the block module includes a seventh transistor, a gate of the seventh transistor is connected to the control signal line, a first electrode of the seventh transistor is connected to the second electrode of the second transistor, and a second electrode of the seventh transistor is connected to the output terminal for outputting the driving current.

18. A circuit driving method of the array substrate as claimed in claim 11, comprising:

within a first period during which an active level is on any row of scan lines, outputting an active level to the reset signal line, and outputting a preset voltage to the plurality of columns of data voltage signal lines; and within a second period during which an active level is on this row of scan lines, outputting an inactive level to the reset signal line, and outputting a group of data voltages corresponding to this row to the plurality of columns of data voltage signal lines, wherein the display driving circuit further comprises a block module disposed between the second electrode of the second transistor and the output terminal for outputting the driving current is further comprised in the pixel unit; the block module being connected to one control signal line, and configured to block outputting of the driving current of the pertained pixel unit when an active level is on the control signal line connected thereto; and the circuit driving method further comprises:

when an active level is on any row of scan lines, outputting an active level to the control signal line connected to the block module within the pixel unit corresponding to this row of scan lines.

19. A display device, comprising the array substrate as claimed in claim 10.

20. The display device according to claim 19, further comprises an organic light-emitting layer disposed on the array substrate and an electrode layer disposed on the organic light-emitting layer; the organic light-emitting layer is in mutual contact with the output terminal within each of the pixel units.

* * * * *